US009136981B2

(12) United States Patent
Luby et al.

(10) Patent No.: US 9,136,981 B2
(45) Date of Patent: Sep. 15, 2015

(54) BLOCK AGGREGATION OF OBJECTS IN A COMMUNICATION SYSTEM

(75) Inventors: Michael G. Luby, Berkeley, CA (US); Mark Watson, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 806 days.

(21) Appl. No.: 12/717,054

(22) Filed: Mar. 3, 2010

(65) Prior Publication Data

US 2011/0216841 A1 Sep. 8, 2011

(51) Int. Cl.
| H04K 1/10 | (2006.01) |
| H04L 1/00 | (2006.01) |
| H03M 13/27 | (2006.01) |
| H03M 13/37 | (2006.01) |
| H03M 13/00 | (2006.01) |

(52) U.S. Cl.
CPC ............ *H04L 1/0057* (2013.01); *H03M 13/27* (2013.01); *H03M 13/373* (2013.01); *H03M 13/3761* (2013.01); *H03M 13/611* (2013.01); *H03M 13/6356* (2013.01); *H03M 13/6502* (2013.01); *H04L 1/0071* (2013.01)

(58) Field of Classification Search
CPC .............. H03M 13/27; H03M 13/373; H03M 13/3761; H03M 13/6356; H03M 13/6502; H04L 1/0057; H04L 1/007
USPC ................... 375/148, 229, 232, 233, 240.01, 375/240.25, 259, 260, 265, 316, 340, 350; 714/752, 758, 781, 784, 786, 800
See application file for complete search history.

(56) References Cited

U.S. PATENT DOCUMENTS

| 7,418,651 B2 | 8/2008 | Luby et al. |
| 7,676,735 B2 | 3/2010 | Luby et al. |
| 2003/0058958 A1 | 3/2003 | Shokrollahi et al. |

(Continued)

FOREIGN PATENT DOCUMENTS

| CN | 1126011 A | 7/1996 |
| JP | 2005136719 A | 5/2005 |

(Continued)

OTHER PUBLICATIONS

Roca, V., et al., "Reed-Solomon Forward Correction (FEC) Schemes for FECFRAME", Internet draft, Downloaded from http://tools.ietf.org/html/draft-roca-fecframe-rs-00, Mar. 4, 2009, 32 pages.

(Continued)

*Primary Examiner* — Syed Haider
(74) *Attorney, Agent, or Firm* — Ryan N. Farr (57) ABSTRACT

A method of mapping m individual objects to source symbols for delivering data from a transmitter to a receiver in a communication system, the m individual objects ordered from object 1 to object m, wherein m>1, includes: aggregating the m individual objects into an aggregate object, including for each individual object j, calculating a number of source symbols S(j) for containing data of the individual object j; and partitioning the aggregate object into Z source blocks, including for each source block k and each individual object j, calculating a number of source symbols NSS(j, k) of individual object j in source block k, wherein the S(j) source symbols for each individual object j are arranged consecutively within consecutive source blocks, starting from a first source block for which NSS(j, k)>0 to a last source block for which NSS(j, k)>0.

28 Claims, 3 Drawing Sheets

(56) References Cited

U.S. PATENT DOCUMENTS

| | | | |
|---|---|---|---|
| 2005/0138268 A1* | 6/2005 | Gemmell | 711/100 |
| 2005/0257106 A1* | 11/2005 | Luby et al. | 714/710 |
| 2007/0018940 A1 | 1/2007 | Park | |
| 2007/0189401 A1* | 8/2007 | Watson et al. | 375/259 |
| 2009/0067551 A1* | 3/2009 | Chen et al. | 375/340 |
| 2009/0080510 A1* | 3/2009 | Wiegand et al. | 375/240.01 |
| 2009/0177942 A1* | 7/2009 | Hannuksela et al. | 714/752 |
| 2009/0210547 A1* | 8/2009 | Lassen et al. | 709/230 |
| 2010/0023525 A1* | 1/2010 | Westerlund et al. | 707/10 |

FOREIGN PATENT DOCUMENTS

| | | |
|---|---|---|
| JP | 2008508761 A | 3/2008 |
| JP | 2008514084 A | 5/2008 |
| WO | WO-2006013459 A1 | 2/2006 |
| WO | WO-2006030329 A1 | 3/2006 |
| WO | WO-2006135877 A2 | 12/2006 |
| WO | WO-2009124768 A1 | 10/2009 |
| WO | WO-2009137705 | 11/2009 |

OTHER PUBLICATIONS

International Search Report and Written Opinion—PCT/US2011/027078—ISA/EPO—May 30, 2011.

Roma A N Belda et al: "Multimedia System for Emergency Services over TETRA-DVBT Networks", Software Engineering and Advanced Applications, 2008. SEAA '08. 34th Euromicro Conference, IEEE, Piscataway, NJ, USA, Sep. 3, 2008, pp. 142-149, XP031380039, ISBN: 978-0-7695-3276-9 Section 3.

Luby, et al., "Raptor Codes for Reliable Download Delivery in Wireless Broadcast Systems", IEEE CCNC, 2006, pp. 192-197.

\* cited by examiner

BLOCK AGGREGATION OF OBJECTS IN A COMMUNICATION SYSTEM

CROSS-REFERENCES TO RELATED APPLICATIONS

The following reference is included here and is incorporated by reference for all purposes: U.S. Pat. No. 7,418,651 entitled "File Download and Streaming System" issued to Luby, et al. (hereinafter "Luby I").

BACKGROUND

Transmission of files and streams between a sender and a recipient over a communications channel has been the subject of much literature. Preferably, a recipient desires to receive an exact copy of data transmitted over a channel by a sender with some level of certainty. Where the channel does not have perfect fidelity (which covers most all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected, a simple parity code might be best.

Data transmission is straightforward when a transmitter and a receiver have all of the computing power and electrical power needed for communications and the channel between the transmitter and receiver is clean enough to allow for relatively error-free communications. The problem of data transmission becomes more difficult when the channel is in an adverse environment or the transmitter and/or receiver has limited capability.

One solution is the use of forward error correcting (FEC) techniques, wherein data is coded at the transmitter such that a receiver can recover from transmission erasures and errors. Where feasible, a reverse channel from the receiver to the transmitter allows the receiver to communicate about errors to the transmitter, which can then adjust its transmission process accordingly. Often, however, a reverse channel is not available or feasible. For example, where the transmitter is transmitting to a large number of receivers, the transmitter might not be able to handle reverse channels from all those receivers. As a result, communication protocols often need to be designed without a reverse channel and, as such, the transmitter may have to deal with widely varying channel conditions without a full view of those channel conditions.

The problem of data transmission between transmitters and receivers is made more difficult when the receivers need to be low-power, small devices that might be portable or mobile and need to receive data at high bandwidths. For example, a wireless network might be set up to deliver files or streams from a stationary transmitter to a large or indeterminate number of portable or mobile receivers either as a broadcast or as multicast where the receivers are constrained in their computing power, memory size, available electrical power, antenna size, device size, and other design constraints.

In such a system, considerations to be addressed include having little or no reverse channel, limited memory, limited computing cycles, mobility, and timing. Preferably, the design should minimize the amount of transmission time needed to deliver data to potentially a large population of receivers, where individual receivers might be turned on and off at unpredictable times, move in and out of range, incur losses due to link errors, cell changes, congestion in cells forcing lower priority file or stream packets to be temporarily dropped, etc.

In the case of a packet protocol used for data transport, a file, stream, or other block of data to be transmitted over a packet network is partitioned into equal size input symbols and input symbols are placed into consecutive packets. The "size" of an input symbol can be measured in bits, whether or not the input symbol is actually broken into a bit stream, where an input symbol has a size of M bits when the input symbol is selected from an alphabet of $2^M$ symbols. In such a packet-based communication system, a packet oriented coding scheme might be suitable. A file transmission is called reliable if it allows the intended recipient to recover an exact copy of the original file even in the face of erasures in the network. A stream transmission is called reliable if it allows the intended recipient to recover an exact copy of each part of the stream in a timely manner even in the face of erasures in the network. Both file transmission and stream transmission can also be somewhat reliable, in the sense that some parts of the file or stream are not recoverable or for streaming, if some parts of the stream are not recoverable in a timely fashion. Packet loss often occurs because sporadic congestion causes the buffering mechanism in a router to reach its capacity, forcing it to drop incoming packets. Protection against erasures during transport has been the subject of much study.

It is known to use chain reaction codes to allow for generation of an arbitrary number of output symbols from the input symbols of a file or stream. This has many uses, including the generation of output symbols in an information additive way, as opposed to an information duplicative way, wherein the latter is where a receiver receives additional data that duplicates data the receiver already knows. Novel techniques for generating, using and operating chain reaction codes are shown, for example, in U.S. Pat. No. 6,307,487 entitled "Information Additive Code Generator and Decoder for Communication Systems" issued to Luby ("Luby II"), U.S. Pat. No. 6,320,520 entitled "Information Additive Group Code Generator and Decoder for Communication Systems" issued to Luby et al. (hereinafter "Luby III"), and U.S. Pat. No. 7,068,729 entitled "Multi-Stage Code Generator and Decoder for Communication Systems" issued to Shokrollahi et al. (hereinafter "Shokrollahi"). To the extent permitted, the entire disclosures of those are herein incorporated by reference for all purposes.

One property of the output symbols produced by a chain reaction encoder is that a receiver is able to recover the original file or block of the original stream as soon as enough output symbols have been received. Specifically, to recover the original K input symbols with a high probability, the receiver needs approximately K+A output symbols. The ratio A/K is called the "relative reception overhead." The relative reception overhead depends on the number K of input symbols, and on the reliability of the decoder. For example, in one specific embodiment, and where K is equal to 60,000, a relative reception overhead of 5% ensures that the decoder successfully decodes the input file or block of the stream with a probability of at least $1-10^{-8}$; and where K is equal to 10,000, a relative reception overhead of 15% ensures the same success probability of the decoder. In one embodiment, the relative reception overhead of chain reaction codes can be computed as $(13*sqrt(K)+200)/K$, where $sqrt(K)$ is the square root of the number of input symbols K. In this embodiment, the relative reception overhead of chain reaction codes tends to be larger for small values of K.

Luby II, Luby III, and Shokrollahi provide teachings of systems and methods that can be employed in certain embodiments described in this disclosure. It is to be understood, however, that the Luby II, Luby III, and Shokrollahi systems and methods are not required of the apparatus, systems, and methods described in this disclosure, and many other variations, modifications, or alternatives can also be used.

It is also known to use multi-stage chain reaction ("MSCR") codes, such as those described in Shokrollahi and developed by Digital Fountain, Inc. under the trade name "Raptor" codes. Multi-stage chain reaction codes are used, for example, in an encoder that receives input symbols from a source file or source stream, generates intermediate symbols therefrom and encodes the intermediate symbols using chain reaction codes. More particularly, a plurality of redundant symbols is generated from an ordered set of input symbols to be transmitted. A plurality of output symbols are generated from a combined set of symbols including the input symbols and the redundant symbols, wherein the number of possible output symbols is much larger than the number of symbols in the combined set of symbols, wherein at least one output symbol is generated from more than one symbol in the combined set of symbols and from less than all of the symbols in the combined set of symbols, and such that the ordered set of input symbols can be regenerated to a desired degree of accuracy from any predetermined number, N, of the output symbols.

For some applications, other variations of codes might be more suitable or otherwise preferred.

In delivering multiple objects (e.g., files) in a broadcast, multicast, or other setting, it is often more efficient to bundle multiple small objects into one larger object and then apply FEC encoding across the large object for delivery than to apply FEC encoding to the individual small objects for delivery. However, there are often constraints on the amount of memory available at a receiver for FEC decoding, and this often places an upper limit on the size of a source block over which FEC decoding can be efficiently performed.

SUMMARY

An exemplary method of mapping m individual objects to source symbols for delivering data from a transmitter to a receiver in a communication system, the m individual objects ordered from object 1 to object m, wherein m>1, according to the disclosure includes: aggregating the m individual objects into an aggregate object, including for each individual object j for j=1 to m, calculating a number of source symbols $S(j)$ for containing data of the individual object j; and partitioning the aggregate object into Z source blocks, including for each source block k for k=0 to Z−1 and each individual object j for j=1 to m, calculating a number of source symbols $NSS(j, k)$ of individual object j in source block k, wherein the $S(j)$ source symbols for each individual object j are arranged consecutively within consecutive source blocks, starting from a first source block for which $NSS(j, k)>0$ to a last source block for which $NSS(j, k)>0$.

Embodiments of such a method may include one or more of the following features. Bytes of data of each individual object j are arranged consecutively within the $S(j)$ source symbols for the individual object j, starting from source symbol 0 to source symbol $S(j)-1$. The method further includes padding with zero values one or more source symbols of the m individual objects. Partitioning the aggregate object into Z source blocks further includes for each integer j from 1 to m, calculating an aggregate number of source symbols $SS(j)$ in the first j individual objects, wherein $SS(0)=0$ and $SS(j)$ is a sum of $S(i)$ over all integers i from 1 to j. The method further includes encoding the Z source blocks of the aggregate object to generate repair symbols. The method further includes mapping the source symbols to source packets and mapping the repair symbols to repair packets. The method further includes transmitting one or more of the source packets and the repair packets to the receiver.

An exemplary method of recovering an individual object mapped to source symbols for data delivered from a transmitter to a receiver in a communication system, the individual object aggregated with other individual objects in an aggregate object, the aggregate object partitioned into one or more source blocks, the source symbols of the individual object arranged consecutively within consecutive source blocks of the aggregate object, includes: receiving one or more packets of data, each packet of data including at least one source symbol of the individual object or at least one repair symbol containing repair data for one of the source blocks of the aggregate object, the source block including at least one source symbol of the individual object; and recovering the individual object using the one or more received packets of data.

Embodiments of such a method may include the feature wherein recovering the individual object further includes recovering the individual object using the one or more received packets of data and one or more previously obtained source symbols of the individual object.

An apparatus configured to map m individual objects to source symbols for delivering data to a receiver in a communication system, the m individual objects ordered from object 1 to object m, wherein m>1, includes: a processor configured to aggregate the m individual objects into an aggregate object and partition the aggregate object into Z source blocks, including calculating, for each individual object j for j=1 to m, a number of source symbols $S(j)$ for containing data of the individual object j, and calculating, for each source block k for k=0 to Z−1 and each individual object j for j=1 to m, a number of source symbols $NSS(j, k)$ of individual object j in source block k, wherein the $S(j)$ source symbols for each individual object j are arranged consecutively within consecutive source blocks, starting from a first source block for which $NSS(j, k)>0$ to a last source block for which $NSS(j, k)>0$.

Embodiments of such an apparatus may include one or more of the following features. Bytes of data of each individual object j are arranged consecutively within the $S(j)$ source symbols for the individual object j, starting from source symbol 0 to source symbol $S(j)-1$. The processor is further configured to pad with zero values one or more source symbols of the m individual objects. The processor is further configured to calculate an aggregate number of source symbols $SS(j)$ in the first j individual objects, wherein $SS(0)=0$ and $SS(j)$ is a sum of $S(i)$ over all integers i from 1 to j. The apparatus further includes an encoder communicatively coupled to the processor and configured to encode the Z source blocks of the aggregate object to generate repair symbols. The processor is further configured to map the source symbols to source packets and map the repair symbols to repair packets. The apparatus further includes a transmitter configured to transmit one or more of the source packets and the repair packets to the receiver.

An apparatus configured to recover an individual object mapped to source symbols for data delivered from a transmitter in a communication system, the individual object aggregated with other individual objects in an aggregate object, the aggregate object partitioned into one or more source blocks, the source symbols of the individual object arranged consecutively within consecutive source blocks of the aggregate object, includes: a receiver configured to receive one or more packets of data, each packet of data including at least one source symbol of the individual object or at least one repair symbol containing repair data for one of the source blocks of the aggregate object, the source block including at least one source symbol of the individual object; and a processor communicatively coupled to the receiver and configured to recover the individual object using the one or more received packets of data.

Embodiments of such an apparatus may include the feature wherein the processor is further configured to recover the individual object using the one or more received packets of data and one or more previously obtained source symbols of the individual object.

A computer program product for mapping m individual objects to source symbols for delivering data from a transmitter to a receiver in a communication system, the m individual objects ordered from object 1 to object m, wherein m>1, includes a processor-readable medium storing processor-readable instructions configured to cause a processor to: aggregate the m individual objects into an aggregate object, including for each individual object j for j=1 to m, calculating a number of source symbols S(j) for containing data of the individual object j; and partition the aggregate object into Z source blocks, including for each source block k for k=0 to Z-1 and each individual object j for j=1 to m, calculating a number of source symbols NSS(j, k) of individual object j in source block k, wherein the S(j) source symbols for each individual object j are arranged consecutively within consecutive source blocks, starting from a first source block for which NSS(j, k)>0 to a last source block for which NSS(j, k)>0.

Embodiments of such a product may include one or more of the following features. The processor-readable medium is further configured to cause the processor to consecutively arrange bytes of data of each individual object j within the S(j) source symbols for the individual object j, starting from source symbol 0 to source symbol S(j)-1. The processor-readable medium is further configured to cause the processor to pad with zero values one or more source symbols of the m individual objects. The processor-readable medium is further configured to cause the processor to calculate, for each integer j from 1 to m, an aggregate number of source symbols SS(j) in the first/individual objects, wherein SS(0)=0 and SS(j) is a sum of S(i) over all integers i from 1 to j. The processor-readable medium is further configured to cause the processor to encode the Z source blocks of the aggregate object to generate repair symbols. The processor-readable medium is further configured to cause the processor to map the source symbols to source packets and to map the repair symbols to repair packets. The processor-readable medium is further configured to cause the processor to transmit one or more of the source packets and the repair packets to the receiver.

A computer program product for recovering an individual object mapped to source symbols for data delivered from a transmitter to a receiver in a communication system, the individual object aggregated with other individual objects in an aggregate object, the aggregate object partitioned into one or more source blocks, the source symbols of the individual object arranged consecutively within consecutive source blocks of the aggregate object, includes a processor-readable medium storing processor-readable instructions configured to cause a processor to: receive one or more packets of data, each packet of data including at least one source symbol of the individual object or at least one repair symbol containing repair data for one of the source blocks of the aggregate object, the source block including at least one source symbol of the individual object; and recover the individual object using the one or more received packets of data.

Embodiments of such a product may include the feature wherein the processor-readable medium is further configured to cause the processor to recover the individual object using the one or more received packets of data and one or more previously obtained source symbols of the individual object.

A system configured to map m individual objects to source symbols for delivering data from a transmitter to a receiver in a communication system, the m individual objects ordered from object 1 to object m, wherein m>1, includes: means for aggregating the m individual objects into an aggregate object, including for each individual object j for j=1 to m, calculating a number of source symbols S(j) for containing data of the individual object j; and means for partitioning the aggregate object into Z source blocks, including for each source block k for k=0 to Z-1 and each individual object j for j=1 to m, calculating a number of source symbols NSS(j, k) of individual object j in source block k, wherein the S(j) source symbols for each individual object j are arranged consecutively within consecutive source blocks, starting from a first source block for which NSS(j, k)>0 to a last source block for which NSS(j, k)>0.

Embodiments of such a system may include one or more of the following features. Bytes of data of each individual object j are arranged consecutively within the S(j) source symbols for the individual object j, starting from source symbol 0 to source symbol S(j)-1. The system further includes means for padding with zero values one or more source symbols of the m individual objects. The means for partitioning the aggregate object into Z source blocks further include means for calculating, for each integer j from 1 to m, an aggregate number of source symbols SS(j) in the first/individual objects, wherein SS(0)=0 and SS(j) is a sum of S(i) over all integers i from 1 to j. The system further includes means for encoding the Z source blocks of the aggregate object to generate repair symbols. The system further includes means for mapping the source symbols to source packets and mapping the repair symbols to repair packets. The system further includes means for transmitting one or more of the source packets and the repair packets to the receiver.

A system configured to recover an individual object mapped to source symbols for data delivered from a transmitter to a receiver in a communication system, the individual object aggregated with other individual objects in an aggregate object, the aggregate object partitioned into one or more source blocks, the source symbols of the individual object arranged consecutively within consecutive source blocks of the aggregate object, includes: means for receiving one or more packets of data, each packet of data including at least one source symbol of the individual object or at least one repair symbol containing repair data for one of the source blocks of the aggregate object, the source block including at least one source symbol of the individual object; and means for recovering the individual object using the one or more received packets of data.

Embodiments of such a system may include the feature wherein the means for recovering the individual object further include means for recovering the individual object using the one or more received packets of data and one or more previously obtained source symbols of the individual object.

Items and/or techniques described herein may provide one or more of the following capabilities. Many small individual objects are aggregated into a larger aggregate object partitioned into multiple source blocks such that the network efficiency of the aggregation is obtained even with different loss or error patterns over the different transmitted FEC encodings of the source blocks. File delivery with block aggregation works efficiently when there is a mixed population of receivers that are missing different individual objects from the aggregate object and/or different amounts of the aggregate object. File delivery also works efficiently when the working memory needed for encoding and decoding is smaller than the size of the aggregate object. Source blocks are processed sequentially in the receiver, reducing or minimizing the amount of data each receiver needs to receive to reconstruct the aggregate object. While item/technique-effect pairs have been described, it may be possible for a noted effect to be achieved by means other than those noted, and a noted item/technique may not necessarily yield the noted effect.

BRIEF DESCRIPTION OF THE DRAWINGS

In the figures, components with similar relevant characteristics and/or features may have the same reference label.

DETAILED DESCRIPTION

Techniques described herein provide mechanisms for block aggregation of individual objects for delivering data from a transmitter to a receiver in a communication system. Individual objects are mapped to source symbols for delivering data. The individual objects are aggregated into an aggregate object, including calculating for each individual object a number of source symbols for containing data of the individual object. The aggregate object is then partitioned into one or more source blocks, including calculating a number of source symbols of each individual object in each source block. The mapping of individual objects is such that the source symbols for each individual object are arranged consecutively within consecutive source blocks. The consequence of the consecutive arrangement is that, whenever a first source symbol precedes a second source symbol within an individual object, the second source symbol is mapped to a source block that is not earlier in the ordering of source blocks than the source block to which the first source symbol is mapped. If both source symbols are mapped to the same source block, the first source symbol precedes the second source symbol in the source block, and no source symbols of any other individual objects will be positioned between the first and second source symbols within the source block. Bytes of data of each individual object are arranged consecutively within the source symbols for the individual object, starting from the first source symbol to the last source symbol. The source blocks of the aggregate object are encoded to generate repair symbols. The source symbols are mapped to source packets, while the repair symbols are mapped to repair packets. One or more of the source packets and the repair packets are transmitted to the receiver. The distribution of the individual objects across the different source blocks ensure that the individual objects can be efficiently reconstructed when there is around the same amount of loss or errors incurred in each source block. Other embodiments are within the scope of the disclosure and claims.

Although some examples and embodiments described in this disclosure apply to the Asynchronous Layered Coding (ALC) protocol, the described techniques are not limited in application to ALC. The described techniques can apply, for example, to other packet-based network systems using broadcast, multicast, or unicast transmission for content delivery. Some examples of systems that could benefit from the described techniques include 3rd Generation Partnership Project (3GPP) Multimedia Broadcast and Multicast Services (MBMS), Digital Video Broadcasting-Handheld (DVB-H), Digital Video Broadcasting-Satellite services to Handhelds (DVB-SH), Advanced Television Systems Committee (ATSC) Mobile, Digital Video Broadcasting Internet Protocol television (DVB IPTV), and MediaFLO (e.g., for file delivery service). In another example, the described techniques can be applied to a unicast file delivery protocol, such as Hypertext Transfer Protocol (HTTP), where source and repair symbols for the source blocks would be grouped into files for delivery.

Desired Characteristics of Block Aggregation of Individual Objects

In delivering multiple individual objects to a large population of receivers, for example, in a broadcast or multicast environment or using a unicast delivery infrastructure such as a Content Delivery Network, there are a number of use cases that can arise. Consideration of some of these use cases can help define desired characteristics for techniques of block aggregation of individual objects for delivery. A list of several desired characteristics follows, although other characteristics can be defined, additionally or alternatively.

Characteristic 1 provides that data packets be indexed in units of symbols and not in units of bytes. This would follow the same indexing scheme as defined for file delivery of single objects. For example, in the ALC protocol, each data packet can have an associated Encoding Symbol ID (ESI), which refers to a start symbol for the data contained within the data packet.

Characteristic 2 provides that file delivery with block aggregation should allow systematic FEC codes to be used and allow received source packets as well as repair packets to be used to reconstruct the aggregate object.

Characteristic 3 provides that file delivery with block aggregation should work efficiently when there is a mixed population of receivers that are missing different individual objects from the aggregate object and/or different amounts of the aggregate object. As an example, a particular receiver may already have some of the individual objects of the aggregate object either in whole or in part. To recover the aggregate object, the amount of repair packets the particular receiver would need should be reduced by the aggregate size of those parts of the individual objects the receiver already has relative to the amount of repair packets the receiver would need if the receiver did not already have those parts of the individual objects.

Characteristic 4 provides that file delivery with block aggregation should work efficiently when the working memory needed for encoding and decoding is smaller than the size of the aggregate object. That is, the block aggregation scheme should support partitioning the aggregate object into more than one source block. Furthermore, similar to Characteristic 1, the partitioning of the aggregate object into multiple source blocks should be automatic and optimized. In particular, as with single objects, reception of approximately the same amount of data from each of the source blocks should allow efficient reconstruction of the aggregate object independent of which individual objects that are part of the aggregate object are missing at the receiver. Thus, the block aggregation should allow efficient reconstruction of individual objects within the aggregate object by processing source blocks sequentially in the receiver, reducing or minimizing the amount of data each receiver needs to receive to reconstruct the aggregate object.

Characteristic 5 provides that receivers without FEC should be able to receive sent source packets and use them directly to recover as much of the aggregate object as possible and discard any repair packets.

Characteristic 6 provides that sent source packets for individual objects should be used efficiently in combination with repair packets for the aggregate object to reconstruct the aggregate object efficiently.

Characteristic 7 provides that receivers that are only missing some or some parts of the individual objects that are part of the aggregate object are able to recover the missing individual objects with as little data reception as possible. Further, receivers that have out-dated versions of some of the individual objects that are part of the aggregate object are able to obtain newer versions of the individual objects with as little data reception as possible.

Constraints of Desired Characteristics

The above listed desired characteristics of block aggregation place some interesting constraints on the block aggregation techniques. For example, Characteristic 6 provides that source packets sent for individual objects within the aggregate object should be used efficiently together with the repair packets for the aggregate object; and Characteristic 1 provides that these data packets for individual objects use symbol indexing. Thus, Characteristics 1 and 6 together provide that each individual object within the aggregate object starts at a source symbol boundary, and furthermore, that each source symbol within the aggregate object contains data for only one individual object. As another example, Characteristic 7 also leads to the constraint that each individual object within the aggregate object starts at a symbol boundary.

Characteristics 4 and 7 together provide that the source symbols for individual objects be partitioned as equally as possible across the source blocks of the aggregate object, and that the source symbols for the first part of an individual object should be part of the first source block, and the source symbols for the last part of the individual object should be part of the last source block.

Characteristics 1 and 4 together provide that information about the aggregate object encoding needed by the FEC decoder (e.g., the FEC Object Transmission Information (OTI) of the ALC protocol) be as minimal as possible, and the partitioning scheme automatically aligns individual objects and their symbols within the aggregate object and, in the case of multiple source blocks, across source blocks. Thus, instead of providing the byte positions of the individual objects within the aggregate object, the partitioning scheme automatically determines the positions of the individual objects within the aggregate object, where the individual objects are aligned on symbol boundaries.

Characteristic 7 provides that the information about the aggregate object encoding needed by the FEC decoder should preferably indicate which version of each individual object is contained in the aggregate object. This version information can then be used by receivers to determine which individual objects of the aggregate object they already have. Characteristic 3 then provides that the receivers should need to receive fewer repair packets (e.g., by the size of those parts of the individual objects already known) in order to recover the aggregate object than the number of repair packets that would be needed if the receivers did not already have those parts of the individual objects.

Block Aggregation of Individual Objects

Techniques for block aggregation of individual objects are described below. Generally, the described techniques aggregate multiple individual objects into a larger aggregate object, which can be partitioned into one or more source blocks prior to FEC encoding. The individual objects are automatically aligned within the aggregate object, and within the multiple source blocks if applicable, such that the above desired characteristics are achieved. Repair symbols are generated by the FEC encoding for each source block of the aggregate object. The source symbols and the repair symbols are transmitted within the payload of source packets and repair packets, respectively, to one or more receivers, e.g., through broadcast or multicast.

For block aggregation, the information about the encoding of the aggregate object needed by the FEC decoder (e.g., the FEC OTI) includes the number m of individual objects within the aggregate object, the sizes in bytes $B(1), B(2), \ldots, B(m)$ of the individual objects, the symbol size T in bytes, and the number Z of source blocks for the aggregate object. An indication of the ordering of the individual objects is also provided, where the first individual object is referred to as object 1, the second individual object is referred to as object 2, and so on. In one example, the individual objects can be ordered such that related individual objects that all might be used by a same application are grouped and ordered consecutively. In addition, other information may be included in the information about the aggregate object encoding. For example, a Uniform Resource Identifier (URI) and/or a Transport Object ID (TOI) for each individual object might be included in the FEC OTI, allowing the receiver to know what the individual object is and whether or not the receiver already has an exact copy of the individual object. Repair packets sent for the aggregate object can also have associated identifiers (e.g., TOIs), which differ from any of the identifiers for the individual objects within the aggregate object.

Each source packet contains an object identifier (e.g., a TOI), identifying the individual object associated with the data in the payload, and a data identifier (e.g., a Source FEC Payload ID of the ALC protocol), identifying the source data carried in the payload. The data identifier can indicate the starting index of the first source symbol contained in the source packet (e.g., the ESI). If there is more than one symbol in the source packet, the multiple symbols need to be consecutively indexed.

In one example for the ALC protocol, if the source packets are sent using a different FEC Encoding ID (e.g., FEC Encoding ID=0 corresponding to the No-Code FEC scheme), the Source FEC Payload ID needs to be that associated with the FEC Encoding ID (e.g., a two byte Source Block Number (SBN) followed by a two byte ESI). In this case, the FEC OTI for each individual object needs to be received by receivers, and the symbol size needs to be the same for the individual objects as the symbol size specified for the aggregate object (i.e., the value of T). However, the source block structure may differ between the individual objects and the aggregate object.

Each repair packet for the aggregate object contains an object identifier (e.g., a TOI), identifying the aggregate object, and a data identifier (e.g., a Repair FEC Payload ID of the ALC protocol), identifying the repair data carried in the payload. The data identifier can be, for example, a SBN that identifies the particular source block within the aggregate object and an ESI that identifies the repair symbols carried in the payload that are generated from the identified source block.

Process of Mapping Individual Objects to Source Symbols

Figure 1:
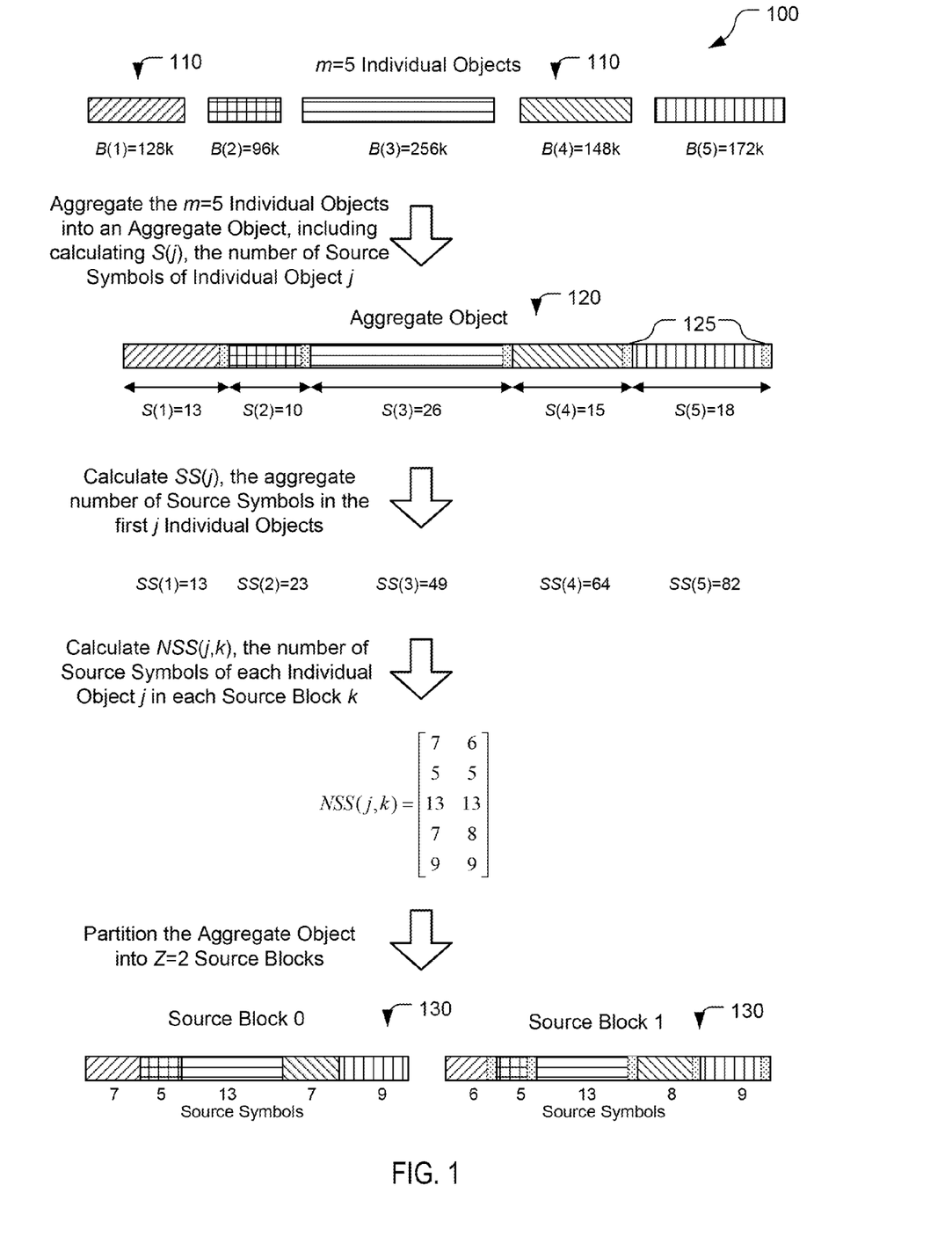
FIG. 1 is a functional illustration of block aggregation of individual objects.
Figure 2:
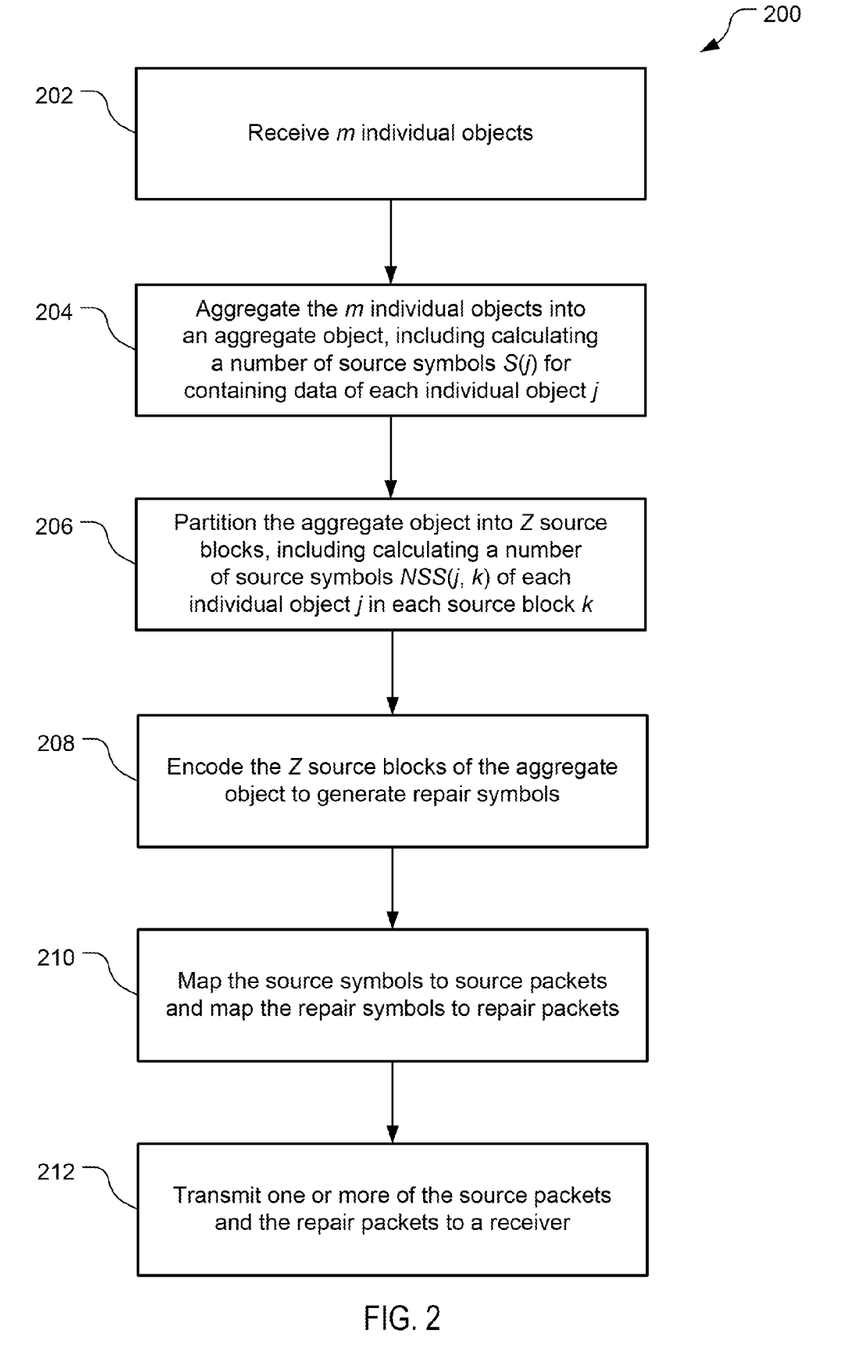
FIG. 2 is a block flow diagram of a process of mapping individual objects to source symbols for delivering data from a transmitter to a receiver in a communication system.

Referring to FIG. 2, with further reference to FIG. 1, a process 200 of mapping individual objects to source symbols for delivering data from a transmitter to a receiver in a communication system includes the stages shown. FIG. 1 is a functional illustration of block aggregation of individual objects. The parameters (i.e., m, B(j), T, and Z) chosen for the example of FIG. 1 are arbitrary and not limiting. The process 200 is exemplary only and not limiting. The process 200 can be altered, e.g., by having stages added, removed, or rearranged.

At stage 202, a processor (e.g., a processor on a source transmitter side of a communication link) receives m individual objects, where m>1. The m individual objects are ordered from object 1 to object m, where each individual object j has a byte size of B(j). In the example of FIG. 1, the m=5 individual objects 110 are small files of data with byte sizes of B(1)=128 kb, B(2)=96 kb, B(3)=256 kb, B(4)=148 kb, and B(5)=172 kb. These individual objects 110 are just examples; individual objects can be greater or smaller in size.

At stage 204, the processor aggregates the m individual objects into an aggregate object. The aggregating includes, for each individual object j for j=1 to m, calculating a number of source symbols S(j) for containing data of the individual object j. The number of source symbols S(j) depends on the symbol size T in bytes. For each integer j from 1 to m, $S(j)=\text{ceil}(B(j)/T)$. Continuing the example of FIG. 1, where T=10 kb, the individual objects 110 have calculated numbers of source symbols S(1)=13, S(2)=10, S(3)=26, S(4)=15, and S(5)=18.

The bytes of data of each individual object j are arranged consecutively within the S(j) source symbols for the individual object j, starting from source symbol 0 to source symbol S(j)−1. One or more source symbols of the m individual objects can be padded with zero values. Source symbol 0 of individual object j corresponds to the first T bytes of individual object j; source symbol 1 of individual object j corresponds to the second T bytes of individual object j; etc. Source symbol S(j)−1 of individual object j corresponds to the last $A(j)=B(j)-\text{floor}(B(j)/T)*T$ bytes of individual object j followed by T−A(j) padding bytes with zero values. In FIG. 1, each individual object j includes zero padding 125 appended to the end of the source data of the individual object j when the individual objects 110 are aggregated into the aggregate object 120. If an individual object j has a byte size B(j) that is an integer multiple of the symbol size T in bytes, the individual object j does not need zero padding.

At stage 206, the processor partitions the aggregate object into Z source blocks, where Z≥1. The partitioning includes, for each source block k for k=0 to Z−1 and each individual object j for j=1 to m, calculating a number of source symbols NSS(j, k) of individual object j in source block k. For individual object j and source block k, $NSS(j, k)=\text{ceil}((SS(j)-k)/Z)-\text{ceil}((SS(j-1)-k)/Z)$, where SS(j) is defined below. The S(j) source symbols for individual object j are arranged consecutively within consecutive source blocks, starting at the lowest indexed source block for which NSS(j, k)>0 and proceeding to the highest indexed source block for which NSS(j, k)>0. If the number of source symbols S(j) for an individual object j is less than the number of source blocks Z, not all the Z source blocks will contain a source symbol for that individual object j.

The partitioning of stage 206 can include, for each integer j from 1 to m, calculating an aggregate number of source symbols SS(j) in the first j individual objects. This calculation includes setting SS(0)=0. For integer j, SS(j) is a sum of S(i) over all integers i from 1 to j. The calculation of SS(j) can be combined with the calculation of NSS(j, k) in one step. In the example of FIG. 1, the aggregate number of source symbols SS(j) is calculated as SS(1)=13, SS(2)=23, SS(3)=49, SS(4)=64, and SS(5)=82.

The aggregate object 120 of FIG. 1 is partitioned into Z=2 source blocks 130. Because S(j) is greater than Z for each individual object j 110, each of the two source blocks 130 contain at least one source symbol for each individual object 110. In this case, only the last source block (i.e., source block Z−1) includes the zero padding 125.

At stage 208, an encoder (e.g., an FEC encoder on the source transmitter side of the communication link) encodes the Z source blocks of the aggregate object to generate repair symbols. That is, for each source block encoded, one or more repair symbols are generated. Each repair symbol contains repair data for the source symbols of the respective encoded source block of the aggregate object.

At stage 210, the processor maps the source symbols to source packets and maps the repair symbols to repair packets. As described above, each packet contains an object identifier and a data identifier. A source packet can contain one or more source symbols, while a repair packet can contain one or more repair symbols.

At stage 212, a transmitter transmits one or more of the source packets and the repair packets to a receiver. For example, the packets can be transmitted to large numbers of receivers through a broadcast or multicast service.

Process of Recovering an Individual Object Mapped to Source Symbols

Figure 3:
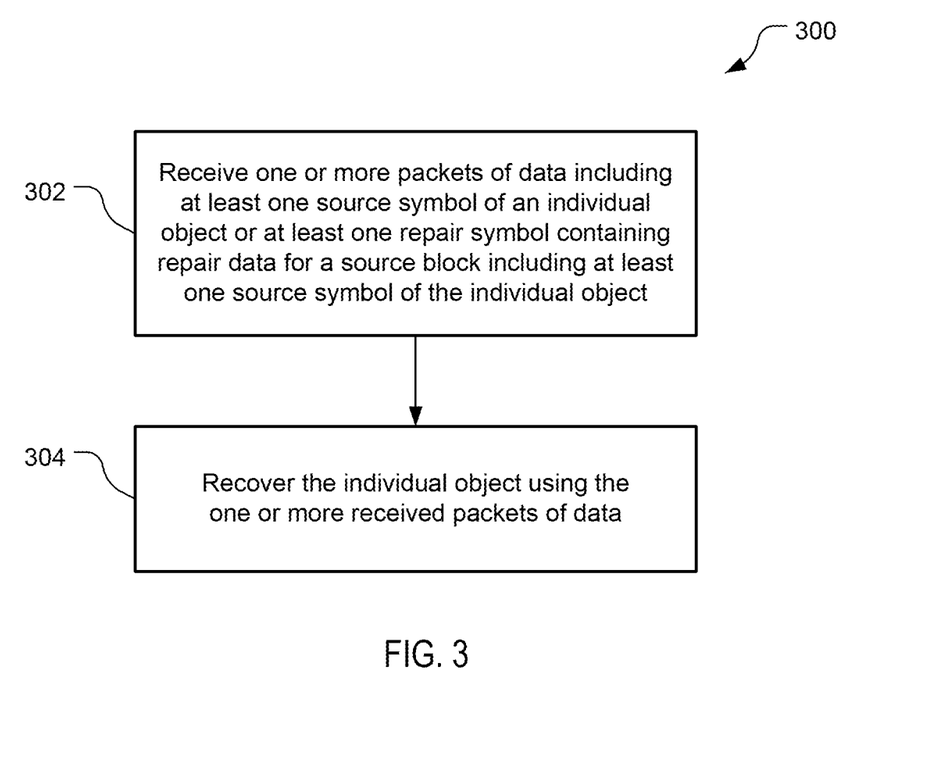
FIG. 3 is a block flow diagram of a process of recovering an individual object mapped to source symbols for data delivered from a transmitter to a receiver in a communication system.

Referring to FIG. 3, a process 300 of recovering an individual object mapped to source symbols for data delivered from a transmitter to a receiver in a communication system includes the stages shown. The process 300 is exemplary only and not limiting. The process 300 can be altered, e.g., by having stages added, removed, or rearranged.

The individual object was aggregated with other individual objects in an aggregate object, where the aggregate object was partitioned into one or more source blocks. The source symbols of the individual object were arranged consecutively within consecutive source blocks of the aggregate object.

At stage 302, a receiver (e.g., a receiver on a receiving side of a communication link) receives one or more packets of data. Each packet of data includes at least one source symbol of the individual object or at least one repair symbol. If the packet of data includes a repair symbol, the repair symbol contains repair data for one of the source blocks of the aggregate object, where the respective source block includes at least one source symbol of the individual object.

At stage 304, a processor (e.g., a processor on the receiving side of the communication link) recovers the individual object using the one or more received packets of data. If the receiving side (e.g., a receiving client device) already has available one or more source symbols of the individual object, the processor can recover the individual object using the one or more source symbols of the individual object in addition to the one or more received packets of data. The receiving side may have previously obtained the one or more source symbols of the individual object, for example, from a previous broadcast or from previous retrieval over unicast.

Properties of Block Aggregation of Individual Objects

When there is only one source block (i.e., Z=1), the first S(1) source symbols of the aggregate object correspond to individual object 1, the next S(2) source symbols correspond to individual object 2, etc. The last S(m) source symbols of the aggregate object correspond to individual object m.

When there is more than one source block (i.e., Z>1), the described techniques of block aggregation achieve the following properties.

Property A is that the source symbols for each individual object j are as equally distributed as possible across the source blocks. That is, for each individual object j, the number of source symbols of individual object j in each of the source blocks is either ceil(S(j)/Z) or floor(S(j)/Z).

Property B is that the source symbols for the aggregate object are as equally distributed as possible across the source blocks. That is, the number of source symbols for the aggregate object in each of the source blocks is either ceil(SS(m)/Z) or floor(SS(m)/Z).

Property C is that the source symbols for the individual objects within a source block are in the same order as the original order of individual objects. However, as described above, if S(j)<Z, then not all source blocks of the aggregate object will contain symbols for individual object j.

Property D is that the source symbols for each individual object j across source blocks are in the same order as they are indexed within the individual object j.

These are all desirable properties. Property A ensures that an incremental update can be efficient. For example, a receiver might already have some of the individual objects of the aggregate object but might be missing other individual objects of the aggregate object. Because the source packets for the missing individual objects are spread almost equally across the source blocks, the receiver needs to receive approximately the same number of repair packets generated from each source block to recover the entire aggregate object. In particular, if the receiver is missing X individual objects, then the disparity across source blocks between the number of source symbols the receiver is missing from each source block is at most X. In general, the expected disparity is closer to sqrt(X). Thus, a good strategy for a sender sending over a channel that may have burst losses is to generate and send only repair packets for the aggregate object, where the sender sends repair packets in rounds. That is, for each round, one repair packet for each of the Z source blocks is sent, where the repair packet for a source block includes one or more repair symbols generated from that source block.

Property B ensures that the encoding and decoding of source blocks for an aggregate object need only consider two sizes of source blocks, which has at least a couple of good consequences: (1) the generation of repair symbols from a source block at the encoder need only consider two different patterns of repair packets to generate for the two different source block sizes; (2) the amount of memory needed at the encoder and decoder is almost identical for encoding or decoding each source block; and (3) if the receiver has none of the individual objects of the aggregate object, then the disparity across source blocks between the number of source symbols the receiver is missing from each source block is at most one.

Properties C and D ensure that if the receiver decodes the source blocks in sequential order, the individual objects will be recovered from beginning to end. One advantage of this is that the beginnings of individual objects can be fed into other applications after the first source block is decoded, while the second source block is being decoded. Properties C and D also ensure that the recovered portions of individual objects are in the same order as the original order of the individual objects. This allows individual objects within an aggregate object to be ordered in such a way that related individual objects that, for example, all might be used by the same application are consecutive.

Desired Characteristics of Block Aggregation Achieved

The disclosed techniques for block aggregation achieve the desired characteristics of block aggregation of individual objects described above.

Characteristic 1 provides that data packets be indexed in units of symbols and not in units of bytes. The block aggregation techniques achieve Characteristic 1. As an example with the ALC protocol, the FEC Payload ID of both source packets and repair packets would contain an ESI that identifies which symbols the packets carry.

Characteristic 2 provides that file delivery with block aggregation should allow systematic FEC codes to be used and allow received source packets as well as repair packets to be used to reconstruct the aggregate object. The block aggregation techniques achieve Characteristic 2, allowing source packets to be sent for individual objects within the aggregate object and ensuring that repair packets are useful to reconstruct efficiently any missing source symbols of the aggregate object.

Characteristic 3 provides that file delivery with block aggregation should work efficiently when there is a mixed population of receivers that are missing different individual objects from the aggregate object either in whole or in part and/or different amounts of the aggregate object. The disclosed partitioning of the individual objects across source blocks of the aggregate object achieves Characteristic 3

Characteristic 4 provides that the block aggregation scheme should support partitioning the aggregate object into more than one source block. Furthermore, the partitioning of the aggregate object into multiple source blocks should be automatic and optimized. The block aggregation should allow efficient reconstruction of individual objects within the aggregate object by processing source blocks sequentially in the receiver, reducing or minimizing the amount of data each receiver needs to receive to reconstruct the aggregate object. The ability in the block aggregation techniques to specify more than one source block and the partitioning of the individual objects across source blocks of the aggregate object achieve Characteristic 4.

Characteristic 5 provides that receivers without FEC should be able to receive sent source packets and use them directly to recover as much of the aggregate object as possible and discard any repair packets. Allowing source packets to be sent for individual objects of the aggregate object achieves Characteristic 5.

Characteristic 6 provides that sent source packets for individual objects should be used efficiently in combination with repair packets for the aggregate object to reconstruct the aggregate object efficiently. The partitioning of the individual objects across source blocks of the aggregate object achieves Characteristic 6.

Characteristic 7 provides that receivers that are only missing some or some parts of the individual objects that are part of the aggregate object are able to recover the missing individual objects with as little data reception as possible. Further, receivers that have out-dated versions of some of the individual objects that are part of the aggregate object are able to obtain newer versions of the individual objects with as little data reception as possible. The partitioning of the individual objects across source blocks of the aggregate object achieves the first part of Characteristic 7. The identifiers contained in packets can include version information for the data included in the packet payload. For example, the version information can include time and date information for the packet data.

Use Cases for Block Aggregation of Individual Objects

Two use cases for block aggregation of individual objects are provided below. The properties of the block aggregation are discussed in the context of the use cases. Advantages of the block aggregation techniques are also provided.

The first use case is for web cache broadcast. Web pages typically include many small objects (e.g., files). For example, some popular news sites can include more than 100 small objects on a web page. Each individual object is identified by a Uniform Resource Locator (URL). Many of these individual objects do not change often and, in normal operation, web browsers cache these individual objects and reuse the cached versions the next time the web page is accessed. HTTP includes mechanisms for signaling how long an object is valid and for checking with the content server to determine whether a cached object has changed without downloading the object again if the object has not changed.

The performance of a mobile web browser could be improved, for example, by delivering the individual objects of popular web pages over a broadcast channel and placing the delivered individual objects in the web browser cache. When that popular web page is accessed by the user, many of the individual objects of the web page would already be in cache and, thus, would not need to be downloaded at the time of access.

In this application, it is desirable to aggregate the small individual objects into larger aggregate objects (e.g., larger files), as this improves the efficiency of the use of Application Layer FEC (AL-FEC) coding on the broadcast channel. It is also desirable to indicate the list of individual objects contained in an aggregate object separately from the aggregate object itself.

A client device receiving the list of individual objects can check its cache to see if the client device already has any of these individual objects. For example, the individual objects might have been received in a previous broadcast, or the individual objects might have been retrieved over unicast. Using those individual objects that the client device already has, the client device can reconstruct a partial copy of the aggregate object. This partial copy can be input as a set of source symbols to the AL-FEC decoding process for the aggregate object.

To avoid the AL-FEC decoding process from receiving duplicate symbols, it is desirable if the broadcast channel transports only repair symbols, although it is still beneficial if the broadcast channel transports source symbols as well as repair symbols.

One approach to aggregating the small individual objects into a large aggregate object would be to concatenate the individual objects or use a standard archive file format, such as 'tar' or 'zip,' and then to segment the archived file into source blocks, each comprising a contiguous portion of the archived file. This approach obtains the benefits of aggregation in terms of AL-FEC performance when a client device does not have any of the broadcast objects beforehand. The approach would allow the client device to use objects the client device already has to improve performance somewhat, as above described.

A better approach is to use the block aggregation techniques described in this disclosure. The described techniques allow the client device to use the individual objects the client device already has to improve performance by much more than the 'tar' or 'zip' approach in the specific case where the aggregate object needs to be broken into more than one source block.

The reason for the difference in performance is that, with the 'tar' or 'zip' approach, the data already present at the client device may be spread unevenly across source blocks. For example, the client device may have 90% of a first source block but only 10% of a second source block. There are good reasons that in a typical transmission, the packets of the source blocks are interleaved. Thus, in order to receive 90% of the data for the second source block, the client device needs to receive 90% of the data for all source blocks. In the above example, the client device would receive 90% of the first source block for which the client device already had 90% of the data. Thus, most of that transmission is wasted.

The described block aggregation techniques of this disclosure ensures that the data already present at the client device is evenly spread across the source blocks, as much as possible (i.e., Property A). Therefore, the fraction of each source block already known at the client device is roughly the same for each source block, and the amount of wasted reception is reduced or minimized.

Another approach to achieve somewhat even spreading would be to first construct an aggregate object by simple concatenation and then randomly permute the symbols of that aggregate object before partitioning the aggregate object into source blocks. The described block aggregation techniques of this disclosure improve on that random approach in two ways.

First, the spreading of the source symbols of individual objects is deterministically even in the described block aggregation techniques. In the random approach, the spreading of the source symbols may not be as even. Second, such a random permutation over a very large aggregate object is inefficient to implement at both the transmitter and the receiver. This is especially so at the receiver, because shuffling data to reassemble individual objects can be expensive, in particular, when considering slower storage devices such as flash memory or hard disks. In contrast, the described block aggregation techniques ensure that when data from an individual object is included in a source block, the data is arranged in a single contiguous chunk in that source block, and moreover, that this chunk of data is a contiguous portion of the individual object as well. This improves implementation efficiency.

The second use case is for systematic small individual object transmission on channels with large burst outages. This example considers the case of an AL-FEC based transmission of multiple small individual objects where: (a) the transmission needs to be systematic, i.e., the source data for the individual objects is sent; (b) the objects are sent sequentially, rather than being interleaved; (c) the transmission suffers burst outages of a duration commensurate with or larger than the transmission time of the individual objects; and (d) FEC protection is provided over the aggregate of the individual objects, rather than per object.

A reason for (a) is to ensure backwards compatibility with receivers that do not support AL-FEC. A reason for (b) is that, when the individual objects are individually useful, it is preferable for the individual objects to become available incrementally during reception.

One example of this use case is a broadcast news service where the individual objects are individual news stories, which are individually useful for presentation to users. Every so often, some repair data for the aggregate of a set of news stories is transmitted to allow client devices to fill in the individual news stories the client devices have missed.

In the generic case, a client device may receive a subset of the source data for the small individual objects, which can be input as source data to the AL-FEC decoding process. Because of (c), it is likely that the client device has a subset of the individual objects, rather than a random collection of pieces of the individual objects. The client device then receives repair data for the aggregate objects, and the exact considerations as in the first use case applies to the combination of source and repair data and the advantages of even distribution of received source data across the source blocks.

Considerations Regarding the Description

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The blocks of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software executed by a processor, firmware, or any combination thereof. If implemented in software executed by a processor, the functions may be stored on or transmitted over as one or more instructions or code on a computer-readable medium. Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of computer-readable media.

The previous description is provided to enable any person skilled in the art to make and/or use the apparatus, systems, and methods described. Various modifications to the disclosure will be readily apparent to those skilled in the art, and the generic principles defined herein may be applied to other variations without departing from the spirit or scope of the disclosure. Thus, the disclosure is not to be limited to the examples and designs described herein but is to be accorded the widest scope consistent with the principles and novel features disclosed herein.

What is claimed is:

1. A method for mapping of m individual objects to source symbols for delivering data from a transmitter to a receiver in a communication system, the m individual objects ordered from object 1 to object m, wherein m>1, the method comprising:

aggregating the m individual objects into an aggregate object, including for each individual object j for j=1 to m, calculating a number of source symbols S(j) for containing data of the individual object j; and partitioning the aggregate object into Z source blocks for forward error correction encoding, wherein the partitioning includes:

calculating a first number of source symbols NSS(j,k) of each individual object j in a first source block of the Z source blocks; and calculating a second number of source symbols NSS(j, k) of each individual object j in a second source block of the Z source blocks, wherein the S(j) source symbols for each individual object j are arranged consecutively within consecutive source blocks k, starting from the first source block for which NSS(j,k)>0 to a last source block for which NSS(j,k)>0, and wherein k=0 to Z−1.

2. The method of claim 1, wherein bytes of data of each individual object j are arranged consecutively within the S(j) source symbols for the individual object j, starting from source symbol 0 to source symbol S(j)−1.

3. The method of claim 1, further comprising padding with zero values one or more source symbols of the m individual objects.

4. The method of claim 1, wherein partitioning the aggregate object into Z source blocks further includes for each integer j from 1 to m, calculating an aggregate number of source symbols SS(j) in the first j individual objects, wherein SS(O)=0 and SS(j) is a sum of S(i) over all integers i from 1 to j.

5. The method of claim 1, further comprising encoding the Z source blocks of the aggregate object to generate repair symbols.

6. The method of claim 5, further comprising mapping the source symbols to source packets and mapping the repair symbols to repair packets.

7. The method of claim 6, further comprising transmitting one or more of the source packets and the repair packets to the receiver.

8. An apparatus configured to map m individual objects to source symbols for delivering data to a receiver in a communication system, the m individual objects ordered from object 1 to object m, wherein m>1, the apparatus comprising:

a processor configured to aggregate the m individual objects into an aggregate object and partition the aggregate object into Z source blocks for forward error correction encoding, wherein the partitioning includes:

calculating, for each individual object j for j=1 to m, a number of source symbols S(j) for containing data of the individual object j, calculating a first number of source symbols NSS(j,k) of each individual object j in a first source block of the Z source blocks; and calculating a number of source symbols NSS(j,k) of each individual object j in a second source block of the Z source blocks, wherein the S(j) source symbols for each individual object j are arranged consecutively within consecutive source blocks, starting from a first source block for which NSS(j,k)>0 to a last source block for which NSS(j,k)>0, and wherein k=0 to Z−1.

9. The apparatus of claim 8, wherein bytes of data of each individual object j are arranged consecutively within the S(j) source symbols for the individual object j, starting from source symbol 0 to source symbol S(j)−1.

10. The apparatus of claim 8, wherein the processor is further configured to pad with zero values one or more source symbols of them individual objects.

11. The apparatus of claim 8, wherein the processor is further configured to calculate an aggregate number of source symbols SS(j) in the first j individual objects, wherein SS(0)=0 and SS(j) is a sum of S(i) over all integers i from 1 to j.

12. The apparatus of claim 8, further comprising an encoder communicatively coupled to the processor and configured to encode the Z source blocks of the aggregate object to generate repair symbols.

13. The apparatus of claim 12, wherein the processor is further configured to map the source symbols to source packets and map the repair symbols to repair packets.

14. The apparatus of claim 13, further comprising a transmitter configured to transmit one or more of the source packets and the repair packets to the receiver.

15. A computer program product for mapping m individual objects to source symbols for delivering data from a transmitter to a receiver in a communication system, the m individual objects ordered from object 1 to object m, wherein m>1, the product comprising:

a non-transitory processor-readable medium storing processor-readable instructions configured to cause a processor to:

aggregate the m individual objects into an aggregate object, including for each individual object j for j=1 to m, calculating a number of source symbols S(j) for containing data of the individual object j; and partition the aggregate object into Z source blocks for forward error correction encoding, wherein the partitioning includes:

calculate a first number of source symbols NSS(j,k) of each individual object j in a first source block of the Z source blocks; and calculate a second number of source symbols NSS(j,k) of each individual object j in a second source block of the Z source blocks, wherein the S(j) source symbols for each individual object j are arranged consecutively within consecutive source blocks, starting from a first source block for which NSS(j, k)>0 to a last source block for which NSS(j, k)>0, and wherein k=0 to Z−1.

16. The product of claim 15, wherein the non-transitory processor-readable medium is further configured to cause the processor to consecutively arrange bytes of data of each individual object j within the S(j) source symbols for the individual object j, starting from source symbol 0 to source symbol S(j)−1.

17. The product of claim 15, wherein the non-transitory processor-readable medium is further configured to cause the processor to pad with zero values one or more source symbols of the m individual objects.

18. The product of claim 15, wherein the non-transitory processor-readable medium is further configured to cause the processor to calculate, for each integer j from 1 to m, an aggregate number of source symbols SS(j) in the first j individual objects, wherein SS(0)=0 and SS(j) is a sum of S(i) over all integers i from 1 to j.

19. The product of claim 15, wherein the non-transitory processor-readable medium is further configured to cause the processor to encode the Z source blocks of the aggregate object to generate repair symbols.

20. The product of claim 19, wherein the non-transitory processor-readable medium is further configured to cause the processor to map the source symbols to source packets and to map the repair symbols to repair packets.

21. The product of claim 20, wherein the non-transitory processor-readable medium is further configured to cause the processor to transmit one or more of the source packets and the repair packets to the receiver.

22. A system configured to map m individual objects to source symbols for delivering data from a transmitter to a receiver in a communication system, the m individual objects ordered from object 1 to object m, wherein m>1, the system comprising:

means for aggregating the m individual objects into an aggregate object, including for each individual object j for j=1 to m, calculating a number of source symbols S(j) for containing data of the individual object j; and means for partitioning the aggregate object into Z source blocks for forward error correction encoding, wherein the partitioning includes:

calculating a first number of source symbols NSS(j,k) of each individual object j in a first source block of the Z source blocks; and calculating a second number of source symbols NSS(j, k) of each individual object j in a second source block of the Z source blocks, wherein the S(j) source symbols for each individual object j are arranged consecutively within consecutive source blocks, starting from a first source block for which NSS(j,k)>0 to a last source block for which NSS(j,k)>0, and wherein k=0 to Z−1.

23. The system of claim 22, wherein bytes of data of each individual object j are arranged consecutively within the S(j) source symbols for the individual object j, starting from source symbol 0 to source symbol S(j)−1.

24. The system of claim 22, further comprising means for padding with zero values one or more source symbols of the m individual objects.

25. The system of claim 22, wherein the means for partitioning the aggregate object into Z source blocks further include means for calculating, for each integer j from 1 to m, an aggregate number of source symbols SS(j) in the first j individual objects, wherein SS(0)=0 and SS(j) is a sum of S(i) over all integers i from 1 to j.

26. The system of claim 22, further comprising means for encoding the Z source blocks of the aggregate object to generate repair symbols.

27. The system of claim 26, further comprising means for mapping the source symbols to source packets and mapping the repair symbols to repair packets.

28. The system of claim 27, further comprising means for transmitting one or more of the source packets and the repair packets to the receiver.

* * * * *